United States Patent
Kobayashi et al.

(10) Patent No.: US 10,580,960 B2
(45) Date of Patent: Mar. 3, 2020

(54) PIEZOELECTRIC DRIVING DEVICE, MOTOR, ROBOT, AND PUMP

(71) Applicant: Seiko Epson Corporation, Tokyo (JP)

(72) Inventors: Tomokazu Kobayashi, Shiojiri (JP); Daisuke Yamada, Shiojiri (JP)

(73) Assignee: Seiko Epson Corporation (JP)

( * ) Notice: Subject to any disclaimer, the term of this patent is extended or adjusted under 35 U.S.C. 154(b) by 492 days.

(21) Appl. No.: 15/417,415

(22) Filed: Jan. 27, 2017

(65) Prior Publication Data
US 2017/0222124 A1 Aug. 3, 2017

(30) Foreign Application Priority Data
Jan. 29, 2016 (JP) ................................. 2016-015772

(51) Int. Cl.
*H01L 41/09* (2006.01)
*B25J 17/00* (2006.01)
*F04B 43/09* (2006.01)
*H01L 41/047* (2006.01)

(52) U.S. Cl.
CPC .............. *H01L 41/09* (2013.01); *B25J 17/00* (2013.01); *F04B 43/095* (2013.01); *H01L 41/0471* (2013.01); *H01L 41/0475* (2013.01); *Y10S 901/19* (2013.01)

(58) Field of Classification Search
CPC . H01L 41/09; H01L 41/0471; H01L 41/0475; H01L 41/0913; B25J 17/00; F04B 17/003; F04B 43/095; H02N 2/004; H02N 2/103; Y10S 901/19

USPC ........................................ 310/311–371, 800
See application file for complete search history.

(56) References Cited

U.S. PATENT DOCUMENTS

| | | | |
|---|---|---|---|
| 2004/0256956 A1 | 12/2004 | Miyazawa | |
| 2009/0284568 A1 | 11/2009 | Yazaki | |
| 2013/0070029 A1* | 3/2013 | Mizukami | B41J 2/14233 347/68 |
| 2013/0162726 A1* | 6/2013 | Mizukami | B41J 2/14233 347/70 |
| 2013/0250007 A1* | 9/2013 | Ishimori | H01L 41/0477 347/70 |

(Continued)

FOREIGN PATENT DOCUMENTS

| | | |
|---|---|---|
| JP | 2004-320979 A | 11/2004 |
| JP | 2008-227123 A | 9/2008 |

(Continued)

*Primary Examiner* — Thomas M Dougherty
(74) *Attorney, Agent, or Firm* — Harness, Dickey & Pierce, P.L.C.

(57) ABSTRACT

A piezoelectric driving device includes a vibrating plate, a first electrode, a piezoelectric layer, a second electrode layer provided above the vibrating plate. An active section is formed in a portion where the first electrode layer, the piezoelectric layer, and the second electrode layer overlap one another. The active section has a longitudinal direction and a latitudinal direction in plan view. At both ends in the latitudinal direction, ends of the first electrode layer are disposed in the same positions as ends of the wiring layer or further on the outer side than the ends, ends of the second electrode layer are disposed in the same positions as the ends of the wiring layer or further on the inner side than the ends, and the ends of the first electrode layer are disposed further on the outer side than the ends of the second electrode layer.

5 Claims, 9 Drawing Sheets

(56) References Cited

U.S. PATENT DOCUMENTS

| | | | |
|---|---|---|---|
| 2014/0114251 A1 | 4/2014 | Miyazaki | |
| 2014/0267506 A1* | 9/2014 | Ohnishi | B41J 2/14201 347/68 |
| 2015/0158184 A1 | 6/2015 | Kamijo et al. | |
| 2016/0008539 A1 | 1/2016 | Miyazaki | |
| 2016/0049574 A1* | 2/2016 | Iwazaki | H02P 25/32 74/490.05 |
| 2018/0048285 A1* | 2/2018 | Nishimura | H03H 9/17 |

FOREIGN PATENT DOCUMENTS

| | | |
|---|---|---|
| JP | 2009-172878 A | 8/2009 |
| JP | 2014-084752 A | 5/2014 |
| JP | 2015-111966 A | 6/2015 |

* cited by examiner

| | PLANE | C-C CROSS SECTION | EVALUATION RESULT |
|---|---|---|---|
| FIG.11A | 130, 250, 150 | 130, 150, 250 | × |
| FIG.11B | 250, 150, 130 | 130, 150, 250 | × |
| FIG.11C | 250, 130, 150 | 130, 150, 250 | × |
| FIG.11D | 150, 130, 250 | 130, 150, 250 | × |
| FIG.11E | 150, 130, 250 | 130, 150, 250 | × |
| FIG.11F | 150, 130, 250 | 130, 150, 250 | × |

PIEZOELECTRIC DRIVING DEVICE, MOTOR, ROBOT, AND PUMP

BACKGROUND

1. Technical Field

The present invention relates to a piezoelectric driving device, a motor, a robot, and a pump.

2. Related Art

An ultrasonic motor, which vibrates a piezoelectric body to drive a body to be driven, is used in various fields because a magnet and a coil are unnecessary in the ultrasonic motor (see, for example, JP-A-2004-320979 (Patent Literature 1)). In the ultrasonic motor, in general, a piezoelectric element (a bulk piezoelectric element) including a bulky piezoelectric body is used (see, for example, JP-A-2008-227123 (Patent Literature 2)).

On the other hand, as the piezoelectric element, there is known a piezoelectric element including a thin film-like piezoelectric body (a thin-film piezoelectric element). The thin-film piezoelectric element is mainly used to perform ejection of ink in a head of an inkjet printer.

If the thin-film piezoelectric element is used in the ultrasonic motor, the ultrasonic motor and an apparatus driven by the ultrasonic motor can be reduced in size. However, since a piezoelectric layer of the thin-film piezoelectric element is a thin film, a crack is sometimes caused in the piezoelectric layer by stress generated when the driving is performed.

When the thin-film piezoelectric element is used in the ultrasonic motor, since upper and lower electrodes are formed of a thin film of rare metal or the like, wiring resistance sometimes increases. Therefore, as a method of supplementing the conductivity of the electrodes, provision of wires conducting with the electrodes has been examined. However, it has been found that, in the ultrasonic motor in which the thin-film piezoelectric element is used, when the wires are disposed over the piezoelectric element, a relation between the positions of end portions of the wires and the positions of end portions of the electrodes of the piezoelectric element affect insulation resistance of the thin-film piezoelectric element.

SUMMARY

An advantage of some aspects of the invention is to provide a piezoelectric driving device including a thin-film piezoelectric element having high reliability in which the conductivity of an electrode is satisfactory and insulation resistance is satisfactory. Another advantage of some aspects of the invention is to provide an ultrasonic motor including the piezoelectric driving device. Still another advantage of some aspects of the invention is to provide a robot or a pump including the ultrasonic motor.

The advantage can be achieved by the following forms or application examples.

A piezoelectric driving device according to an aspect of the invention includes: a vibrating plate; a first electrode layer provided above the vibrating plate; a piezoelectric layer provided above the first electrode layer; a second electrode layer provided above the piezoelectric layer; an insulating layer provided to cover upper surfaces of the first electrode layer, the piezoelectric layer, and the second electrode layer; and a wiring layer provided above the insulating layer, the wiring layer conducting with the second electrode layer. An active section is formed in a portion where the first electrode layer, the piezoelectric layer, and the second electrode layer overlap one another. The active section has a longitudinal direction and a latitudinal direction in plan view. At both ends in the latitudinal direction, ends of the first electrode layer are disposed in the same positions as ends of the wiring layer or further on the outer side than the ends, ends of the second electrode layer are disposed in the same positions as the ends of the wiring layer or further on the inner side than the ends, and the ends of the first electrode layer are disposed further on the outer side than the ends of the second electrode layer.

In the piezoelectric driving device, end portions of the wiring layer in the latitudinal direction of the active section are formed in the same positions as end portions of the active section or further on the outer side than the end portions of the active section. Therefore, dielectric breakdown at the end portions of the wiring layer less easily occurs. Since the conductivity of the second electrode layer is supplemented by the wiring layer, electromechanical conversion efficiency by the piezoelectric layer is satisfactory.

In the piezoelectric driving device according to the aspect, at least at one end in the longitudinal direction, an end of the first electrode layer may be disposed in the same position as an end of the wiring layer or further on the outer side than the end, an end of the second electrode layer may be disposed in the same position as the end of the wiring layer and further on the inner side than the end, and the end of the first electrode layer may be disposed further on the outer side than the end of the second electrode layer.

In the piezoelectric driving device with this configuration, at least one end portion of the wiring layer in the longitudinal direction of the active section is formed in the same position as an end portion of the active section or further on the outer side than the end portion of the active section. Therefore, dielectric breakdown at the end portion of the wiring layer less easily occurs and insulation resistance is satisfactory. Since the conductivity of the second electrode layer is supplemented by the wiring layer, electromechanical conversion efficiency by the piezoelectric layer is satisfactory.

In the piezoelectric driving device according to the aspect, length in the longitudinal direction of the active section may be 1.001 times or more and 1000 times or less of length of the active section in the latitudinal direction.

In the piezoelectric driving device with this configuration, dielectric breakdown at the end portion of the wiring layer less easily occurs and insulation resistance is satisfactory. Since the conductivity of the second electrode layer is supplemented by the wiring layer, electromechanical conversion efficiency by the piezoelectric layer is satisfactory.

A motor according to another aspect of the invention includes: the piezoelectric driving device described above; and a rotor rotated by the piezoelectric driving device.

Since the motor includes the piezoelectric driving device according to the aspect, efficiency is high. Since the piezoelectric driving device is less easily broken, reliability is high.

A robot according to still another aspect of the invention includes: a plurality of link sections; a joint section configured to connect the plurality of link sections; and the piezoelectric driving device described above and configured to turn the plurality of link sections in the joint section.

Since the robot includes the piezoelectric driving device according to the aspect, efficiency is high. Since the piezoelectric driving device is less easily broken, reliability is high.

A pump according to yet another aspect of the invention includes: the piezoelectric driving device described above; a tube for transporting liquid; and a plurality of fingers configured to occlude the tube according to driving of the piezoelectric driving device.

Since the pump includes the piezoelectric driving device according to the aspect, efficiency is high. Since the piezoelectric driving device is less easily broken, reliability is high.

Note that, in this specification, when it is mentioned that a specific member Y is disposed (or formed) above (or below) a specific member X, this is not limited to a form in which the member Y is directly disposed (or formed) on (or under) the member X and includes a form in which the member Y is disposed (or formed) on (or under) the member X via another member in a range in which action and effect are not hindered.

In this specification, "same" not only indicates "completely the same" but also indicates "the same when a measurement error is taken into account" and "the same in a range in which a function is not spoiled". Therefore, an expression "an end of a first electrode layer is disposed in the same position as an end of a wiring layer" indicates that a shift between the positions of the ends of the layers is within ±10%, desirably within ±5%, more desirably within ±1%, still more desirably within ±0.5%, and particularly desirably within ±0.1% of the length between both ends of one layer when a measurement error and the like are taken into account.

BRIEF DESCRIPTION OF THE DRAWINGS

The invention will be described with reference to the accompanying drawings, wherein like numbers reference like elements.

FIGS. 11A to 11F are schematic views of piezoelectric elements used in experiment examples.

DESCRIPTION OF EXEMPLARY EMBODIMENTS

Figure 1:
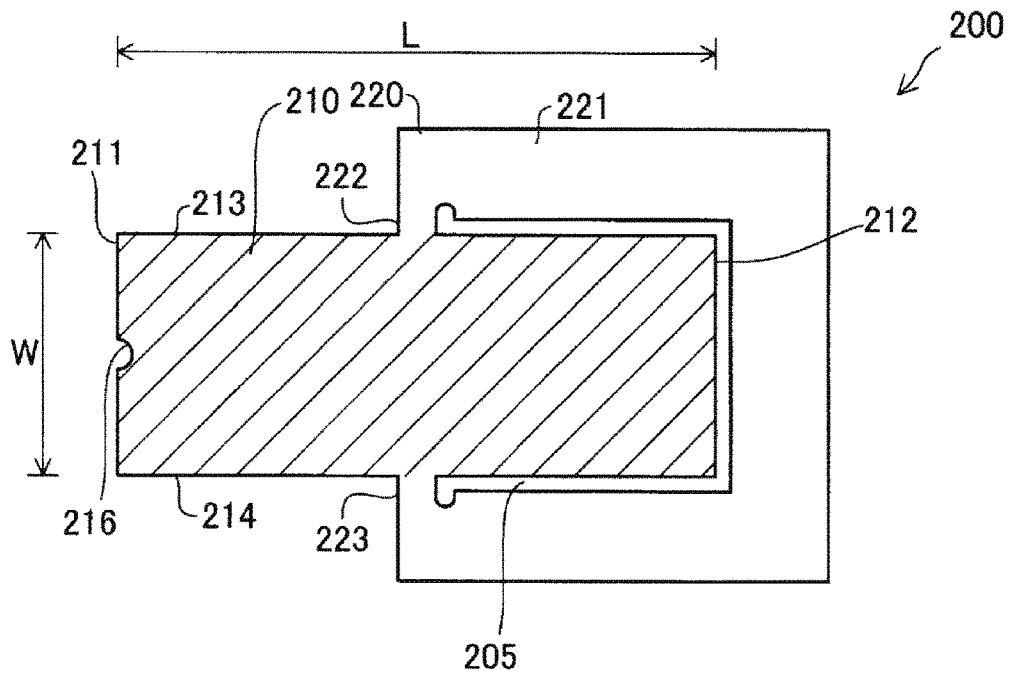
FIG. 1 is a plan schematic view of a vibrating plate of a piezoelectric driving device according to an embodiment.

Several embodiments of the invention are explained below. In the embodiments explained below, examples of the invention are explained. The invention is not limited to the embodiments at all and includes various modified forms implemented in a range in which the gist of the invention is not changed. Note that not all of components explained below are essential components of the invention.

1. Overview of a Piezoelectric Driving Device

A piezoelectric driving device 100 in an embodiment includes at least a vibrating plate 200, a first electrode layer 130, piezoelectric layers 140, second electrode layers 150, an insulating layer 240, and wiring layers 250. Active sections 160 are formed in portions where the first electrode layer 130, the piezoelectric layers 140, and the second electrode layers 150 overlap one another.

Figure 2:
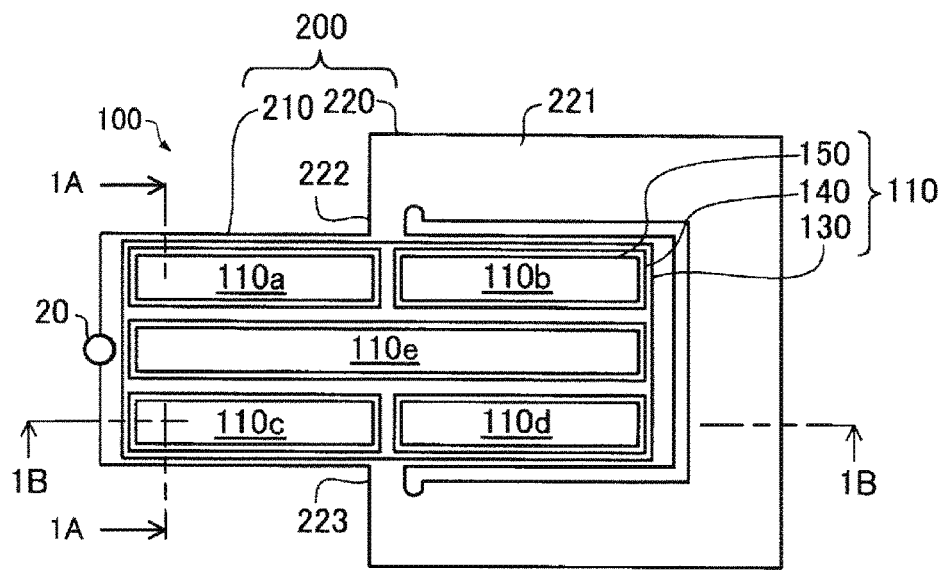
FIG. 2 is a plan schematic view of the piezoelectric driving device according to the embodiment.
Figure 3:
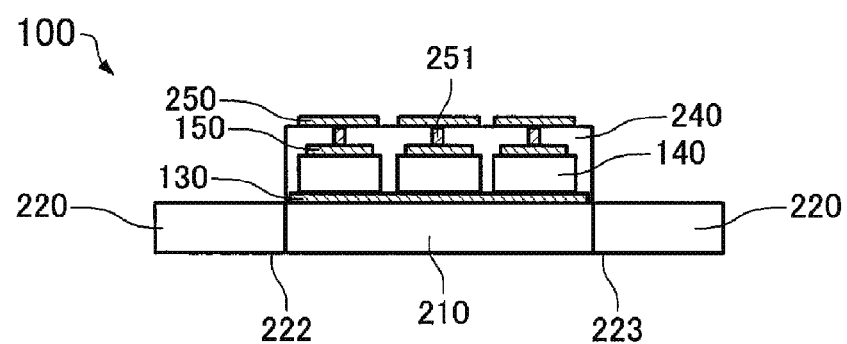
FIG. 3 is a schematic view of a cross section of the piezoelectric driving device according to the embodiment.
Figure 4:
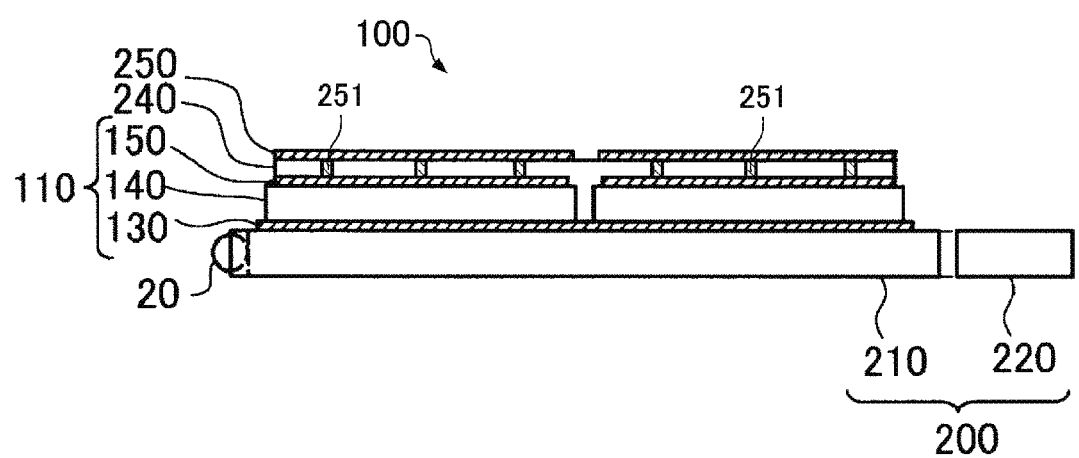
FIG. 4 is a schematic view of a cross section of the piezoelectric driving device according to the embodiment.

FIG. 1 is a plan schematic view of the vibrating plate 200. FIG. 2 is a plan schematic view of a schematic configuration of the piezoelectric driving device 100. FIG. 3 is a schematic view of a cross section of the piezoelectric driving device 100. FIG. 3 is equivalent to a 1A-1A cross section of FIG. 2. FIG. 4 is a schematic view of a cross section of the piezoelectric driving device 100. In the plan view of FIG. 2, illustration of the insulating layer 240 and the wiring layers 250 shown in FIGS. 3 and 4 is omitted. In the piezoelectric driving device 100 in this embodiment, piezoelectric elements 110 are configured by the first electrode layer 130, the piezoelectric layers 140, and the second electrode layers 150.

1.1. Vibrating Plate

As shown in FIG. 1, the vibrating plate 200 includes a vibrating body 210 and a supporting section 220 (a fixed section 221 and connecting sections 222 and 223). In FIG. 1, in order to make it easy to distinguish the vibrating body 210 and the supporting section 220, the vibrating body 210 is hatched and the supporting section 220 (the fixed section 221 and the connecting sections 222 and 223) are not hatched.

The vibrating body 210 has an oblong shape including four sides, that is, a first side 211, a second side 212, a third side 213, and a fourth side 214. The first side 211 and the second side 212 are opposite sides each other. The third side 213 and the fourth side 214 are opposite sides each other. The third side 213 and the fourth side 214 connect the first side 211 and the second side 212 and are longer than the first side 211. The two connecting sections 222 and 223 are respectively provided at end portions of the fixed section 221 and respectively connected the positions of the centers of the third side 213 and the fourth side 214 of the vibrating body 210.

The vibrating body 210 and supporting section 220 are connected substantially in the centers of the long sides of the vibrating body 210. In the supporting section 220, end portions connected to the vibrating body 210 are referred to as "first connecting section 222" and "second connecting section 223". A portion other than the first connecting section 222 and the second connecting section 223 is referred to as "fixed section 221". When the first connecting section 222 and the second connecting section 223 are not distinguished, the "first connecting section 222" and the "second connecting section 223" are respectively referred to as "connecting section 222" and "connecting section 223" as well.

The fixed section 221 is disposed on a side closer to the second side 212 than the first side 211 to turn on the second side 212 side from the first connecting section 222 and reach the second connecting section 223. The vibrating body 210 and the supporting section 220 are integrally formed from one silicon substrate. Specifically, a silicon substrate, on which the piezoelectric elements 110 are formed, is etched, whereby the shape of the individual vibrating plate 200 is formed and a gap 205 between the vibrating body 210 and the supporting section 220 is formed. Consequently, the vibrating body 210 and the supporting section 220 (the fixed section 221 and the connecting sections 222 and 223) are integrally formed.

A ratio of length L of the vibrating body 210 (the length of the third side 213 and the fourth side 214) and width W of the vibrating body 210 (the length of the first side 211 and the second side 212) is not particularly limited. However, the ratio L:W is approximately 9:1 to approximately 6:4 and is desirably approximately 7:2. Values of the ratio in the degrees are desirable for the vibrating body 210 to perform ultrasound vibration in which the vibrating body 210 bends to the left and the right along the plane of the vibrating body 210. The length L of the vibrating body 210 can be set to, for example, a range of 0.1 mm or more and 30 mm or less. The width W of the vibrating body 210 can be set to, for example, a range of 0.02 mm or more and 9 mm or less. Note that, from a viewpoint of a reduction in size, the length L of the vibrating body 210 is desirably set to 50 mm or less.

A concave section 216 is formed on the first side 211 of the vibrating body 210. A contactor 20 capable of coming into contact with a member to be driven is fit in the concave section 216 and jointed (usually, bonded). The contactor 20 is a member that comes into contact with the member to be driven to give a force to the member to be driven. The contactor 20 is formed of a material having durability such as ceramics (specifically, alumina ($Al_2O_3$), zirconia ($ZrO_2$), silicon nitride ($Si_3N$), etc.).

Note that the vibrating plate 200 may be configured from, for example, a silicon vibrating plate 200 and a base layer provided on the silicon vibrating plate 200. The base layer is, for example, an insulating layer. The base layer maybe configured from, for example, a stacked body of a silicon oxide layer provided on the silicon vibrating plate 200 and a zirconium oxide layer provided on the silicon oxide layer.

The vibration plate 200 has a flat shape. As shown in FIG. 1, the vibrating body 210 of the vibrating plate 200 has a shape including a longitudinal direction and a latitudinal direction orthogonal to the longitudinal direction. In an example shown in the figure, a plane shape of the vibrating body 210 of the vibrating plate 200 is an oblong. The longitudinal direction is a direction in which a long side extends. The latitudinal direction is a direction in which a short side extends. In the vibrating body 210, piezoelectric elements explained below (stacked structures of the first electrode layer 130, the piezoelectric layers 140, and the second electrode layers 150) are provided. The piezoelectric elements are driven, whereby the vibrating body 210 can be deformed and vibrate. A plane shape of the vibrating body 210 is a rectangle in the example shown in the figure but is not limited to the rectangle. The size and the thickness of the vibrating body 210 are not particularly limited either.

The vibrating plate 200 is used as a substrate for forming the first electrode layer 130, the piezoelectric layers 140, and the second electrode layers 150 in a film forming process. The vibrating body 210 of the vibrating plate 200 also has a function of a vibrating plate that performs mechanical vibration. Besides silicon, the vibrating plate 200 can also be formed of $Al_2O_3$, $ZrO_2$, and the like. As the vibrating plate 200 made of silicon (referred to as "silicon vibrating plate 200" as well), for example, an Si wafer for semiconductor manufacturing can be used.

The thickness of the vibrating plate 200 is desirably set to, for example, a range of 10 μm or more and 100 μm or less. If the thickness of the vibrating plate 200 is set to 10 μm or more, it is possible to relatively easily treat the vibrating plate 200 in film formation processing on the vibrating plate 200. Note that, if the thickness of the vibrating plate 200 is set to 50 μm or more, it is possible to more easily treat the vibrating plate 200. If the thickness of the vibrating plate 200 (the vibrating body 210) is set to 100 μm or less, it is possible to more easily vibrate the vibrating body 210 according to expansion and contraction of the piezoelectric layers 140 formed of a thin film.

On the vibrating plate 200, layers of a conductor (an electrode, etc.), a dielectric body, a piezoelectric body, and an insulating body, and the like are formed. The thickness of the vibrating plate 200 does not need to be uniform. For example, the thickness of the connecting sections 222 and 223 of the vibrating plate 200 may be smaller than the thickness of the vibrating body 210 and the supporting section 220. The thickness of a specific portion of the vibrating plate 200 may be different from the thickness of the other portions. Such a structure can be relatively easily formed, for example, when the vibrating plate 200 is formed by a silicon substrate.

1.2. Piezoelectric Elements

As shown in FIGS. 2 to 4, the piezoelectric elements 110 are provided above the vibrating body 210 of the vibrating plate 200. The piezoelectric elements 110 include the first electrode layer 130, the piezoelectric layers 140 formed above the first electrode layer 130, and the second electrode layers 150 formed above the piezoelectric layers 140. The first electrode layer 130 and the second electrode layers 150 sandwich the piezoelectric layers 140.

The piezoelectric elements 110 include portions where the first electrode layer 130, the piezoelectric layers 140, and the second electrode layers 150 overlap one another (overlap in plan view). Electric fields (voltages) are applied from the first electrode layer 130 and the second electrode layers 150, whereby the piezoelectric layers 140 are deformed (electro-mechanically converted) in the portions. In this specification, the portions are defined as the active sections 160.

In this embodiment, the piezoelectric driving device 100 includes five piezoelectric elements 110a, 110b, 110c, 110d, and 110e as the piezoelectric elements 110. The piezoelectric element 110e is formed in a substantially oblong shape and is formed along the longitudinal direction of the vibrating body 210 in the center in the width direction of the vibrating body 210. The piezoelectric elements 110a, 110b, 110c, and 110d are formed in the positions of the four corners of the vibrating body 210 and formed in a substantially oblong shape. Note that, in FIG. 2, an example is shown in which the piezoelectric elements 110 are formed on one surface of the vibrating body 210. However, the piezoelectric elements 110 may be formed on two surfaces of the vibrating body 210. In this case, for example, the piezoelectric elements 110a to 110e on one surface and the piezoelectric elements 110a to 110e on the other surface are disposed in symmetrical positions with respect to the vibrating body 210 serving as a plane of symmetry.

In this embodiment, the active sections 160 have a longitudinal direction and a latitudinal direction in plan view. In an example shown in the figures, a direction along the long side of the oblong of the piezoelectric element is the longitudinal direction and a direction along the short side of the oblong is the latitudinal direction. The length in the longitudinal direction of the active sections 160 is 1.001 times or more and 1000 times or less, desirably 1.1 times or more and 100 times or less, and more desirably twice or more and 10 times or less of the length in the latitudinal direction. When the active sections 160 have dimensions in this range, an improvement effect of the insulation resistance is more conspicuous. Note that the active sections 160 may be square in plan view. In this case, directions parallel to sides adjacent to each other may be respectively treated as the longitudinal direction and the latitudinal direction for convenience sake.

The piezoelectric elements 110 are configured above the vibrating body 210 of the vibrating plate 200 by sets of the first electrode layer 130, the piezoelectric layers 140, and the second electrode layers 150. However, the shape, the number, the disposition, and the like of the piezoelectric elements 110 are optional as long as the vibrating body 210 can generate predetermined vibration. An appropriate voltage is applied to the first electrode layer 130 and/or the second electrode layers 150 connected by the wiring layers 250 and the like shown in FIGS. 3 and 4, whereby the respective piezoelectric elements 110 are driven. It is possible to bend to vibrate or extend and contract to vibrate the vibrating plate 200.

1.2.1. First Electrode Layer

The first electrode layer 130 is provided above the vibrating body 210 of the vibrating plate 200. Layers having functions such as adhesion, crystal control, orientation control, and insulation may be formed between the first electrode layer 130 and the vibrating plate 200.

The first electrode layer 130 may be formed over the entire surface of the vibrating body 210 or may be formed in a part of the vibrating body 210. In an example shown in FIG. 2, the first electrode layer 130 is formed substantially entirely above the vibrating body 210 and the connecting sections 222 and 223 of the vibrating plate 200.

A part or the entire region provided in the vibrating body 210 of the first layer 130 is disposed to be opposed to the second electrode layers 150. In the part, the first electrode layer 130 functions as one electrode of the piezoelectric element 110.

The thickness of the first electrode layer 130 is, for example, 10 nm or more and 1 μm or less, desirably 20 nm or more and 800 nm or less, more desirably 30 nm or more and 500 nm or less, and still more desirably 50 nm or more and 300 nm or less.

The first electrode layer 130 is formed of a material having conductivity such as metal, an alloy, or a conductive oxide. Specific examples of the material of the first electrode layer 130 includes various kinds of metal such as nickel, iridium, platinum, Ti, Ta, Sr, In, Sn, Au, Al, Fe, Cr, and Cu, conductive oxides of the kinds of metal (e.g., iridium oxide), a composite oxide of strontium and ruthenium ($SrRuO_x$: SRO), and a complex oxide of lanthanum and nickel ($LaNiO_x$:LNO). The first electrode layer 130 may be a single-layer structure of the illustrated material or may be a structure obtained by stacking a plurality of the materials. The first electrode layer 130 can be etched and patterned according to the rules in semiconductor manufacturing and the like.

1.2.2. Piezoelectric Layers

The piezoelectric layers 140 are provided above the first electrode layer 130 above the vibrating body 210 of the vibrating plate 200. Layers having functions such as adhesion, crystal control, orientation control, and insulation may be formed between the first electrode layer 130 and the piezoelectric layers 140. When the adhesion layer is provided, the material of the adhesion layer is, for example, a TiW layer, a Ti layer, a Cr layer, a NiCr layer, or a stacked body of these layers.

The piezoelectric layers 140 are located between the first electrode layer 130 and the second electrode layers 150. The piezoelectric layers 140 may be formed above the entire surface of the first electrode layer 130 or may be formed above a part of the first electrode layer 130. The piezoelectric layers 140 may be formed above the vibrating plate 200 on which the first electrode layer 130 is not formed. In the example shown in FIGS. 2 to 4, the piezoelectric layers 140 are formed above the first electrode layer 130 of the vibrating body 210 of the vibrating plate 200.

The piezoelectric layers 140 may be provided above the connecting sections 222 and 223. In this case, if the piezoelectric layers 140 are configured on the connecting sections 222 and 223, the piezoelectric layers 140 sometimes hinder vibration of the vibrating body 210. Therefore, it is desirable to provide the piezoelectric layers 140 taking this into account. Further, when the piezoelectric layers 140 are provided above the connecting sections 222 and 223 and piezoelectric elements are not configured, it is desirable to provide the piezoelectric layers 140 taking into account the thickness of the connecting sections 222 and 223 of the vibrating plate 200 and the thickness of the piezoelectric layers 140 to prevent the rigidity of the connecting sections 222 and 223 from becoming excessively large. In the example shown in FIGS. 2 to 4, the piezoelectric layers 140 are patterned and removed in a portion where the piezoelectric elements are not configured.

In the example shown in the figure, a plane shape of the piezoelectric layers 140 is an oblong. However, the piezoelectric layers 140 do not have to be patterned. For example, the piezoelectric layers 140 may be formed entirely on the vibrating plate 200 or on the vibrating body 210. Even in this case, the active sections 160 can be defined from a positional relation between the first electrode layer 130 and the second electrode layers 150. The piezoelectric layers 140 configure piezoelectric elements in portions (the active sections 160) sandwiched by the first electrode layer 130 and the second electrode layers 150. The piezoelectric layers 140 can be deformed by the action of electromechanical conversion when voltages are applied from both the electrodes.

The thickness of the piezoelectric layers 140 is, for example, 50 nm or more and 20 μm or less and desirably 1 μm or more and 7 μm or less. In this way, the piezoelectric elements 110 are thin-film piezoelectric elements. If the thickness of the piezoelectric layers 140 is in this range, an output of the piezoelectric driving device 100 is sufficient. Even if an applied voltage to the piezoelectric layers 140 is increased to increase the output, the piezoelectric layers 140 less easily cause dielectric breakdown. If the thickness of the piezoelectric layers 140 is in this range, a crack is less easily caused in the piezoelectric layers 140 and a driving voltage less easily rises. Further, if the thickness of the piezoelectric layers 140 is in this range, it is possible to generate a sufficiently large force and reduce the piezoelectric driving device 100 in size.

Examples of the material of the piezoelectric layers 140 include a piezoelectric material of a perovskite type oxide. Specifically, the material of the piezoelectric layers 140 is, for example, lead zirconate titanate (Pb(Zr, Ti)$O_3$: PZT), lead zirconate titanate niobate (Pb(Zr, Ti, Nb)$O_3$: PZTN), barium titanate, lead titanate, potassium niobate, lithium niobate, lithium tantalate, sodium tungstate, zinc oxide, barium strontium titanate (BST), strontium bismuth tantalate (SBT), lead metaniobate, lead zinc niobate, or scandium lead niobate.

The piezoelectric layers 140 may be formed using a material showing a piezoelectric effect other than ceramic, for example, polyvinylidene fluoride or quartz. Among these materials, the PZT and the PZTN are particularly suitable as the material of the piezoelectric layers 140 because piezoelectric characteristics of the PZT and the PZTN are satisfactory. The piezoelectric layers 140 can be etched and patterned according to the rules in semiconductor manufacturing and the like. The piezoelectric layers 140 can be electromechanically converted and can be deformed (expanded and contracted) when voltages (electric fields) are applied by the first electrode layer 130 and the second electrode layers 150.

1.2.3. Second Electrode Layers

The second electrode layers 150 are provided above the piezoelectric layers 140. Layers having functions such as adhesion, crystal control, orientation control, and insulation may be formed between the second electrode layers 150 and the piezoelectric layers 140. When the adhesion layer is provided, the material of the adhesion layer is, for example, a TiW layer, a Ti layer, a Ni layer, a Cr layer, a NiCr layer, or a stacked body of these layers.

Apart or the entire region provided in the vibrating body 210 of the second electrode layers 150 is disposed to be opposed to the first electrode layer 130. In the part, the second electrode layers 150 function as one electrodes of the piezoelectric elements 110.

The second electrode layers 150 may be formed over the entire surface of the vibrating body 210 as long as the second electrode layers 150 can form the piezoelectric elements 110 while forming a set with the first electrode layer 130 and the piezoelectric layers 140. That is, if the first electrode layer 130 is patterned, a set of predetermined piezoelectric elements can be configured even if the second electrode layers 150 are formed over the entire surface of the vibrating body 210. That is, in the example shown in the figures, the first electrode layer 130 is a common electrode of a plurality of piezoelectric elements and the second electrode layers 150 are individual electrodes of the plurality of piezoelectric elements. However, the second electrode layer 150 may be a common electrode of the plurality of piezoelectric elements and a plurality of the first electrode layers 130 may be individual electrodes of the plurality of piezoelectric elements.

As shown in FIGS. 2 to 4, a plane shape of the second electrode layers 150 is an oblong. In the example shown in the figures, the first electrode layer 130 is a common electrode and is entirely provided on the vibrating plate 200. Therefore, the active sections 160, which are regions where electric fields (voltages) are applied to the piezoelectric layers 140, are defined by the shape of the second electrode layers 150. Although not shown in the figure, for example, when the first electrode layer 130 is patterned and formed and the second electrode layer 150 is formed as a common electrode, the active sections 160 are defined by the shape of the first electrode layer 130.

The thickness of the second electrode layers 150 is, for example, 50 nm or more and 10 μm or less. The second electrode layers 150 are, for example, Cu layers, Au layers, Al layers, Ni layers, or stacked bodies of the layers.

1.3. Insulating Layer

As shown in FIGS. 3 and 4, the insulating layer 240 is provided to cover the piezoelectric elements 110. The insulating layer 240 is provided between the wiring layers 250 and the piezoelectric elements 110. In the example shown in the figures, the insulating layer 240 is provided on the upper surface of the first electrode layer 130, the side surfaces of the piezoelectric layers 140, and the upper surfaces and the side surfaces of the second electrode layers 150. The insulating layer 240 may be provided between the electrodes and the wiring layers 250. The insulating layer 240 has a function of insulating the electrodes and wires.

The material of the insulating layer 240 is, for example, silicon oxide ($SiO_x$), aluminum oxide ($AlO_x$), tantalum oxide ($TaO_x$), hafnium oxide ($HfO_x$), epoxy resin, or acrylic resin and may be a stacked structure of layers of these materials. In the insulating layer 240, contact holes can be formed in predetermined positions. Connection (contact) of predetermined wires can be performed by forming vias according to the rules in semiconductor manufacturing and the like.

The thickness of the insulating layer 240 (the interval between the wiring layers 250 and the piezoelectric elements 110 (the second electrode layers 150)) is, for example, μm or more and 10 μm or less. If the thickness is in this range, the thickness of the piezoelectric driving device 100 does not become excessively large. The vibration of the vibrating body 210 is less easily hindered by the insulating layer 240. It is possible to achieve a reduction in the size of the piezoelectric driving device 100.

1.4. Wiring Layers

The wiring layers 250 are provided above the insulating layer 240. The wiring layers 250 are electrically connected (conducted) to the second electrode layers 150 via contact sections 251. The wiring layers 250 are configured from, for example, titanium-tungsten layers and copper layers provided on the titanium-tungsten layers. The wiring layers 250 may further include conductive adhesion layers provided between the titanium-tungsten layers and the insulating layer 240. Conductive layers such as the adhesive layers can be regarded as the wiring layers 250. A plurality of the contact sections 251 may be provided for one piezoelectric element 110.

The wiring layers 250 conduct with the second electrode layers 150, whereby the conductivity of the second electrode layers 150 is improved. That is, the conductivity of the second electrode layers 150 is supplemented by the wiring layers 250. Therefore, electromechanical conversion efficiency by the piezoelectric layers 140 is improved. In the example shown in the figures, the thickness of the wiring layers 250 is the same degree as the thickness of the second electrode layers 150. However, the wiring layers 250 can be formed thicker than the second electrode layers 150 according to necessity. The thickness of the wiring layers 250 is, for example, 50 nm or more and 10 μm or less, desirably 100 nm or more and 5 μm or less, and more desirably 200 nm or more and 3 μm or less. If the wiring layers 250 have the thickness of this degree, it is possible to secure sufficient conductivity.

The wiring layers 250 can be patterned as appropriate to configure wires. For example, the wiring layers 250 can form wires and may form not-shown pads (terminals for connection to the outside) or the like.

As shown in FIGS. 2 and 3, the wiring layers 250 may be formed above the second electrode layers 150 to cover the second electrode layers 150. In the example shown in FIGS. 2 and 3, the wiring layers 250 are electrically connected to the second electrode layers 150 via the contact sections 251 formed in a plurality of contact holes. Consequently, the conductivity of the second electrode layers 150 can be supplemented by the wiring layers 250. Further, the wiring layers 250 can also function as one electrodes of the piezoelectric elements together with the second electrode layers 150. Therefore, since the conductivity of the wiring layers 250 is satisfactory, it is possible to improve electromechanical conversion efficiency of the piezoelectric elements and improve the reliability of the piezoelectric driving device 100.

The material of the wiring layers 250 is not particularly limited. The wiring layers 250 are formed of a conductive material, for example, various kinds of metal such as nickel, iridium, platinum, Ti, Ta, Sr, In, Sn, Au, Al, Fe, Cr, and Cu or alloys of the kinds of metal. The wiring layers 250 can be etched and patterned according to the rules in semiconductor manufacturing and the like. The contact sections 251 can also be etched and patterned according to the rules in semiconductor manufacturing and the like.

Further, although not shown in the figures, a second insulating layer may be provided above the wiring layers 250. The material of the second insulating layer may be the same as the material of the insulating layer 240. The thickness of the second insulating layer may be larger than the thickness of the insulating layer 240. Further, although not shown in the figures, second wiring layers may be provided on the second insulting layer. The material of the second wiring layers may be the same as the material of the wiring layers 250. The second insulating layer, the second wiring layers, and the like can be provided as appropriate according to design of wires.

2. Disposition of the First Electrode Layer, the Second Electrode Layer, and the Wiring Layer The first electrode layer 130, the second electrode layer 150, and the wiring layer 250 of the piezoelectric driving device 100 in this embodiment are disposed (formed) as explained below. FIGS. 5A to 5E are plan schematic views of the piezoelectric element 110 in this embodiment and sectional schematic views taken along the longitudinal direction or the latitudinal direction of the piezoelectric element 110. In FIGS. 5A to 5E, the active section 160 is hatched.

The piezoelectric element 110 shown in FIGS. 5A to 5E indicates an example of anyone of the piezoelectric elements 110a, 110b, 110c, 110d, and 110e shown in FIG. 2. Scales in the longitudinal direction and the latitudinal direction can be changed as appropriate. As shown in FIGS. 5A to 5E, the active section 160 of the piezoelectric element 110 of the piezoelectric driving device 100 in this embodiment has a longitudinal direction and a latitudinal direction in plan view.

According to the examination by the inventors, it has been found that, in general, when the active section 160 having the longitudinal direction and the latitudinal direction in plan view is formed, dielectric breakdown easily occurs at both ends in the latitudinal direction in plan view and less easily occurs at end portions in the longitudinal direction. From such knowledge, the first electrode layer 130, the second electrode layer 150, and the wiring layer 250 of the piezoelectric element 110 in this embodiment are disposed (formed) as explained below.

As shown in FIGS. 5A to 5E, at both the ends in the latitudinal direction (in the up-down direction in the figures) in plan view of the active section 160 of the piezoelectric element 110 in this embodiment, ends of the first electrode layer 130 are disposed in the same positions as ends of the wiring layer 250 (see FIG. 5C) or further on the outer side than the ends (see FIGS. 5A, 5B, 5D, and 5E). Ends of the second electrode layer 150 are disposed in the same positions as the ends of the wiring layer 250 (see FIG. 5B) or further on the inner side than the ends (see FIGS. 5A, 5C, 5D, and 5E). The ends of the first electrode layer 130 are disposed further on the outer side than the ends of the second electrode layers 150 (see FIGS. 5A to 5E).

In the piezoelectric element 110 in this embodiment, the ends of the first electrode layer 130 are disposed further on the outer side than the ends of the second electrode layer 150. Consequently, a crack less easily occurs in the piezoelectric layer 140.

In the piezoelectric element 110 in this embodiment, at both the ends in the latitudinal direction in plan view of the active section 160, the ends of the wiring layer 250 are located in the same positions as one of the ends of the first electrode layer 130 and the ends of the second electrode layer 150 or between the ends of the first electrode layer 130 and the ends of the second electrode layer 150. Consequently, dielectric breakdown less easily occurs at both the ends in the latitudinal direction of the active section 160 in plan view.

Figure 5:
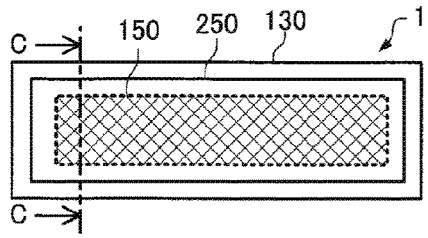
FIGS. 5A to 5E are schematic views of piezoelectric elements according to the embodiment.

On the other hand, concerning ends in the longitudinal direction of the active section 160 in plan view, it is unnecessary to adopt such disposition. For example, in FIG. 5D, at one of the ends in the longitudinal direction (the left direction in the figure) in plan view of the active section 160 of the piezoelectric element 110 in this embodiment, an end of the first electrode layer 130 is disposed further on the inner side than an end of the wiring layer 250. In FIG. 5E, at both the ends in the longitudinal direction (the left-right direction in the figure) in plan view of the active section 160 of the piezoelectric element 110 in this embodiment, ends of the first electrode layer 130 are disposed further on the inner side than ends of the wiring layer 250. As explained above, dielectric breakdown at the ends in the longitudinal direction less easily occurs. Therefore, even in the disposition shown in FIGS. 5D and 5E, it is possible to achieve the effect of suppressing dielectric breakdown at both the ends in the latitudinal direction.

However, as in the disposition in the latitudinal direction explained with reference to FIGS. 5A to 5C, concerning the disposition in the longitudinal direction of the active section 160, if, at least at one end in the longitudinal direction in plan view of the active section 160 of the piezoelectric element 110, the end of the first electrode layer 130 is disposed in the same position as the end of the wiring layer 250 or further on the outside than the end, the end of the second electrode layer 150 is disposed in the same position as the end of the wiring layer 250 or further on the inner side than the end, and the end of the first electrode layer 130 is disposed further on the outer side than the end of the second electrode layer 150, dielectric breakdown at the end portions in the longitudinal direction of the wiring layer 250 less easily occurs. Therefore, the disposition is desirable. Note that, when the second wiring layer is further stacked above the wiring layer 250, disposition of end portions of the second wiring layer is not particularly limited.

3. Action and Effect

In the piezoelectric driving device 100 in this embodiment, the end portions of the wiring layer 250 in the latitudinal direction of the active section 160 are disposed in the same positions as the end portions of the active section 160 or further on the outer side than the end portions. Therefore, dielectric breakdown at the end portions of the wiring layer 250 less easily occurs. Since the conductivity of the second electrode layer 150 is supplemented by the wiring layer 250, electromechanical conversion efficiency by the piezoelectric layer 140 is satisfactory. In the piezoelectric driving device 100, when at least one end portion of the wiring layer 250 in the longitudinal direction of the active section 160 is formed in the same position as the end portion of the active section 160 or further on the outer side than the end portion, since dielectric breakdown at the end portion of the wiring layer 250 less easily occurs, it is possible to further improve the insulation resistance.

4. Operation and the Motor of the Piezoelectric Driving Device

Figure 6:
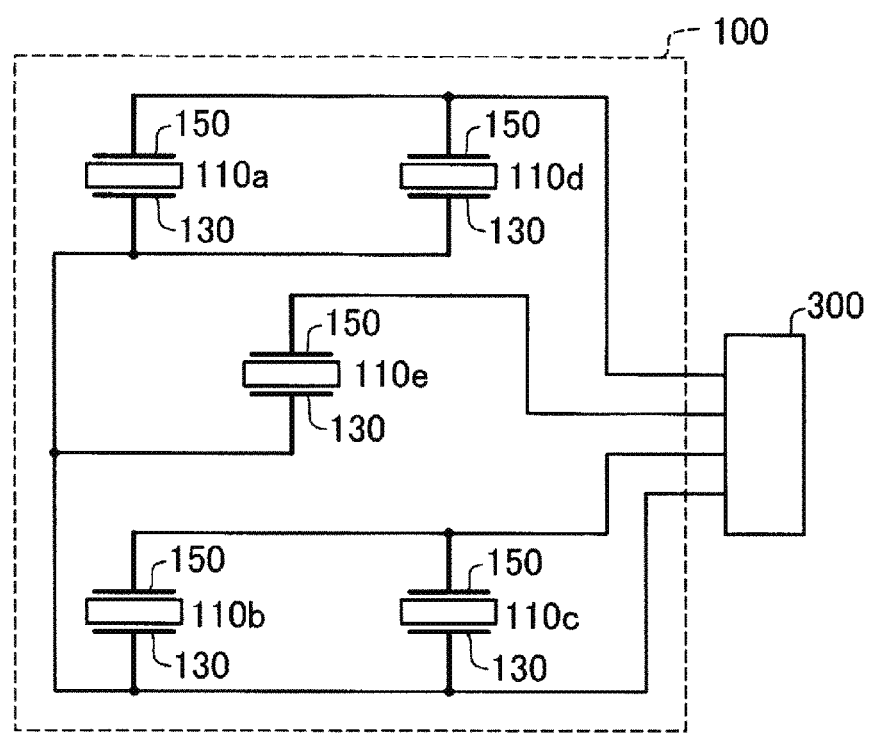
FIG. 6 is an explanatory diagram showing an equivalent circuit of the piezoelectric driving device according to the embodiment.

FIG. 6 is an explanatory diagram showing an equivalent circuit of the piezoelectric driving device 100. As an example of the equivalent circuit shown in FIG. 6, an equivalent circuit that operates one piezoelectric driving device 100 is shown. The piezoelectric elements 110 are classified into three groups. A first group includes two piezoelectric elements 110*a* and 110*d*. A second group includes two piezoelectric elements 110*b* and 110*c*. A third group includes only one piezoelectric element 110*e*. The piezoelectric elements 110*a* and 110*d* of the first group are connected in parallel to each other and connected to a driving circuit 300. The piezoelectric elements 110*b* and 110*c* of the second group are connected in parallel to each other and connected to the driving circuit 300. The piezoelectric element 110*e* of the third group is connected to the driving circuit 300 alone.

The driving circuit 300 is capable of causing the piezoelectric driving device 100 to perform ultrasonic vibration and rotating a rotor (a body to be driven or a member to be driven) in contact with the contactor 20 in a predetermined rotating direction by applying an AC voltage or an undulating voltage, which cyclically changes, between the first electrode layers 130 and the second electrode layers 150 of predetermined piezoelectric elements among the five piezoelectric elements 110*a* to 110*e*, for example, the piezoelectric elements 110*a* and 110*d* of the first group. The "undulating voltage" means a voltage obtained by adding a DC offset to the AC voltage. The direction of a voltage (an electric field) of the undulating voltage is one direction from one electrode to the other electrode. The direction of an electric current is more desirably a direction from the second electrode layer 150 to the first electrode layer 130 than a direction from the first electrode layer 130 to the second electrode layer 150. It is possible to rotate a rotor 50 in contact with the contactor 20 in the opposite direction by applying the AC voltage or the undulating voltage between the first electrode layers 130 and the second electrode layers 150 of the piezoelectric elements 110*b* and 110*c* of the second group.

Figure 7:
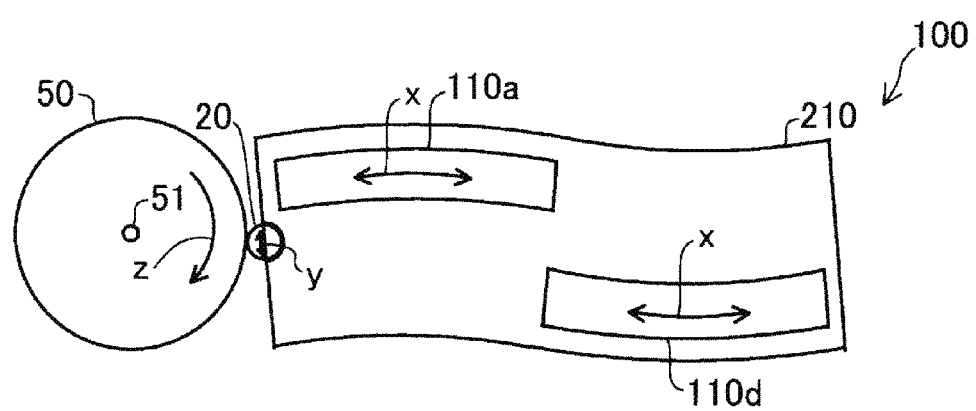
FIG. 7 is a diagram showing an example of the operation of the piezoelectric driving device according to the embodiment.

FIG. 7 is an explanatory diagram showing an example of the operation of the piezoelectric driving device 100. The contactor 20 of the piezoelectric driving device 100 is in contact with the outer circumference of the rotor 50 functioning as a member to be driven. In the example shown in FIG. 7, the AC voltage or the undulating voltage is applied to the two piezoelectric elements 110*a* and 110*d* of the first group. The piezoelectric elements 110*a* and 110*d* expand and contract in a direction of an arrow x in FIG. 7. According to the expansion and contraction of the piezoelectric elements 110*a* and 110*d*, the vibrating body 210 of the piezoelectric driving device 100 bends in the plane of the vibrating body 210 to be deformed into a meandering shape (an S shape). The distal end of the contactor 20 reciprocatingly moves in a direction of an arrow y or elliptically moves. As a result, the rotor 50 rotates in a predetermined direction z (in FIG. 7, the clockwise direction) around a center 51 of the rotor 50. Note that, when the driving circuit 300 applies the AC voltage or the undulating voltage to the two piezoelectric elements 110*b* and 110*c* (see FIG. 2) of the second group, the rotor 50 rotates in the opposite direction. Note that, if the driving circuit 300 applies the AC voltage or the undulating voltage to the piezoelectric element 110*e* in the center, since the piezoelectric driving device 100 expands and contracts in the longitudinal direction, it is possible to further increase a force given to the rotor 50 from the contactor 20. Note that such operation of the piezoelectric driving device 100 is described in Patent Literature 1 (JP-A-2004-320979 or U.S. Pat. No. 7,224,102 corresponding thereto), disclosed contents of which are incorporated herein by reference.

Note that, although not shown in the figure, a plurality of the piezoelectric driving devices 100 can be laid one on top of another in the thickness direction of the vibrating plate 200. It is possible to further increase the force given to the rotor 50 by laying the plurality of piezoelectric driving devices 100 one on top of another and setting the contactors 20 of the piezoelectric driving devices 100 in contact with the rotor 50. The plurality of piezoelectric driving devices 100 can also be disposed in the circumferential direction of the outer circumferential surface of the rotor 50. It is possible to further increase the force given to the rotor 50.

5. Robot

Figure 8:
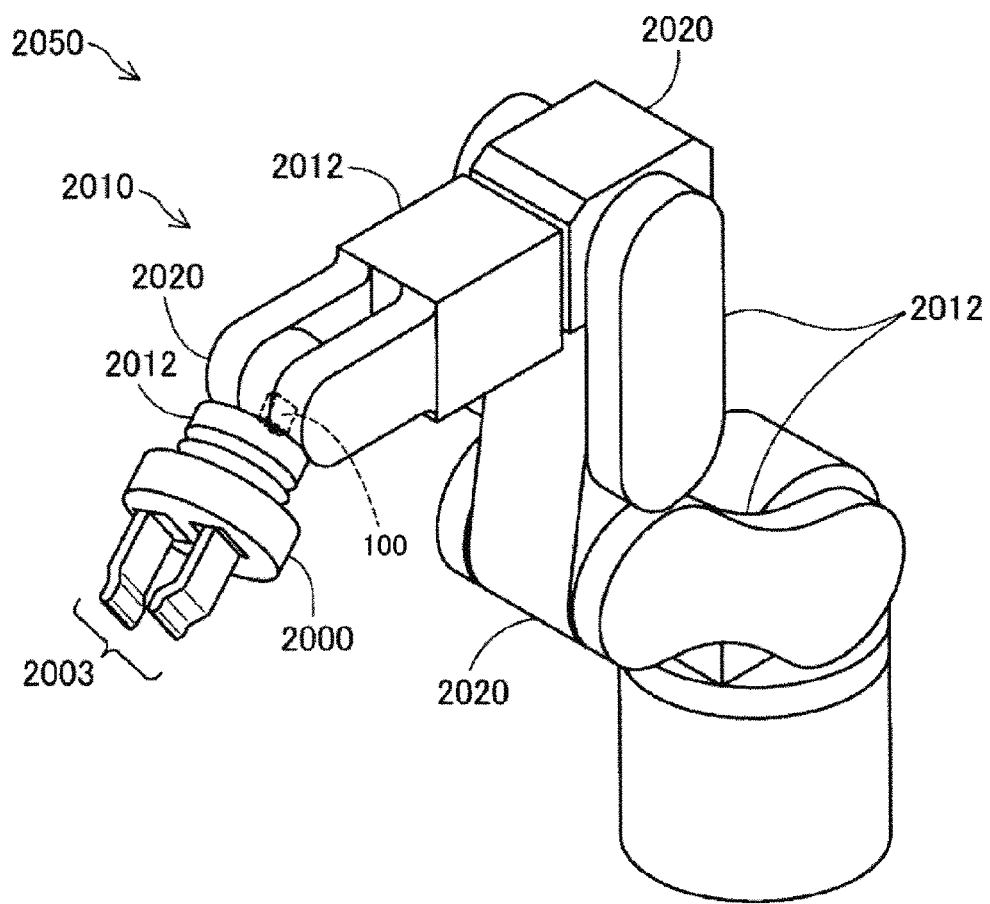
FIG. 8 is a diagram for explaining a robot according to the embodiment.

FIG. 8 is a diagram for explaining a robot 2050 in which the piezoelectric driving devices 100 are used. The robot 2050 includes an arm 2010 (referred to as "arm section" as well) including a plurality of link sections 2012 (referred to as "link members" as well) and a plurality of joint sections 2020 that connect the link sections 2012 in a turnable or bendable state.

The piezoelectric driving devices 100 are incorporated in the respective joint sections 2020. It is possible to turn or bend the joint sections 2020 by any angles using the piezoelectric driving devices 100. A robot hand 2000 is connected to the distal end of the arm 2010. The robot hand 2000 includes a pair of gripping sections 2003. The piezoelectric driving device 100 is incorporated in the robot hand 2000 as well. It is possible to open and close the gripping sections 2003 using the piezoelectric device 100 to grip an object. The piezoelectric driving device 100 is provided between the robot hand 2000 and the arm 2010 as well. It is also possible to rotate the robot hand 2000 with respect to the arm 2010 using the piezoelectric driving device 100.

Figure 9:
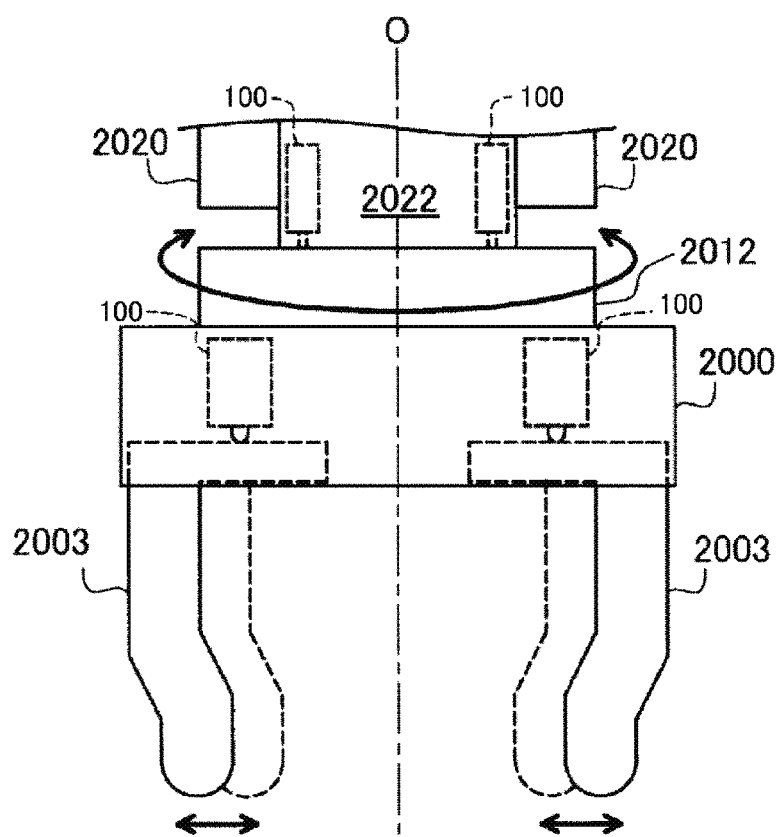
FIG. 9 is a diagram for explaining a wrist portion of the robot according to the embodiment.

FIG. 9 is a diagram for explaining a wrist portion of the robot 2050 shown in FIG. 8. The joint sections 2020 of the wrist sandwich a wrist turning section 2022. The link sections 2012 of the wrist are attached to the wrist turning section 2022 to be capable of turning around a center axis O of the wrist turning section 2022. The wrist turning section 2022 includes the piezoelectric driving device 100. The piezoelectric driving device 100 turns the link sections 2012 of the wrist and the robot hand 2000 around the center axis O. A plurality of gripping sections 2003 are erected on the robot hand 2000. The proximal end portions of the gripping sections 2003 are movable in the robot hand 2000. The piezoelectric driving devices 100 are mounted on base portions of the gripping sections 2003. Therefore, it is possible to move the gripping sections 2003 to grip a target object by operating the piezoelectric driving device 100. Note that the robot 2050 is not limited to a single-arm robot. The piezoelectric driving device 100 is also applicable to a multi-arm robot including two or more arms.

The robot 2050 and the robot hand 2000 in this embodiment include the piezoelectric devices 100 explained above. Therefore, since dielectric breakdown of the piezoelectric driving devices 100 less easily occurs, the robot 2050 and the robot hand 2000 have high reliability.

6. Pump

Figure 10:
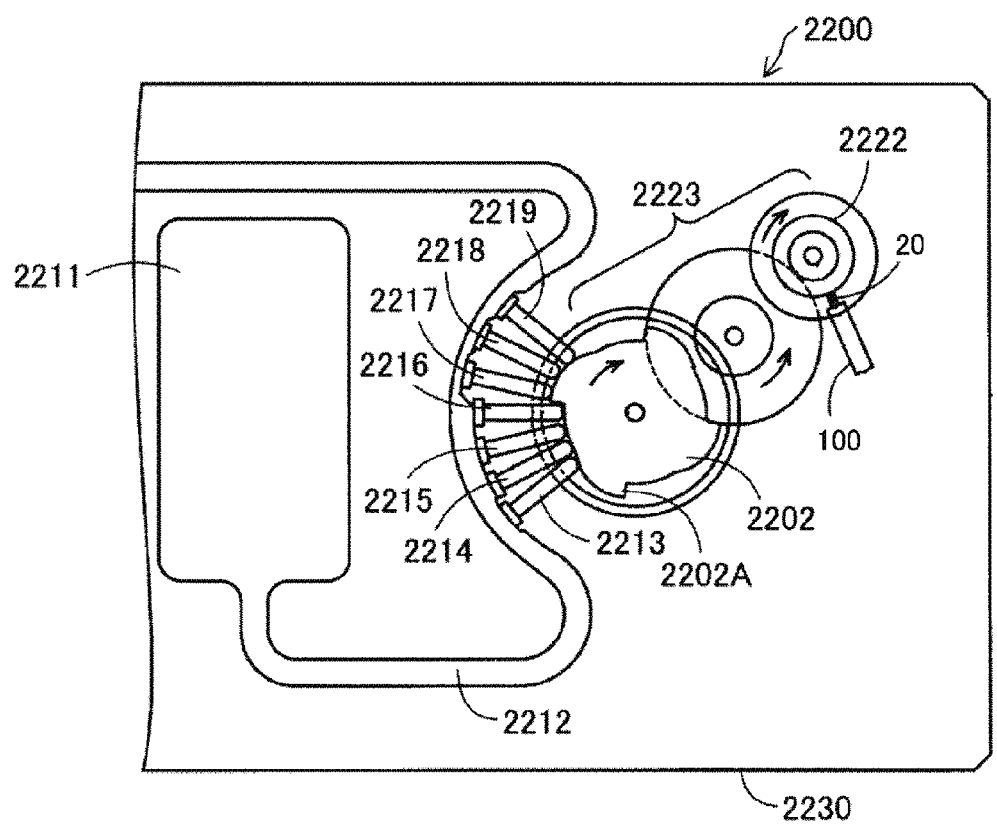
FIG. 10 is a diagram for explaining a pump according to the embodiment.

FIG. 10 is a diagram for explaining an example of a liquid feeding pump 2200 in which the piezoelectric driving device 100 is used. In the liquid feeding pump 2200, a reservoir 2211, a tube 2212, the piezoelectric driving device 100, a rotor 2222, a speed reduction transmission mechanism 2223, a cam 2202, and a plurality of fingers 2213, 2214, 2215, 2216, 2217, 2218, and 2219 are provided in a case 2230.

The reservoir 2211 is a storing section for storing liquid, which is a transportation target. The tube 2212 is a tube for transporting the liquid delivered from the reservoir 2211. The contactor 20 of the piezoelectric driving device 100 is provided in a state in which the contactor 20 is pressed against the side surface of the rotor 2222. The piezoelectric driving device 100 drives to rotate the rotor 2222. A rotation force of the rotor 2222 is transmitted to the cam 2202 via the speed reduction transmission mechanism 2223. The fingers 2213 to 2219 are members for occluding the tube 2212. When the cam 2202 rotates, the fingers 2213 to 2219 are pushed to a radial direction outer side in order by a protrusion section 2202A of the cam 2202. The fingers 2213 to 2219 occlude the tube 2212 in order from a transporting direction upstream side (the reservoir 2211 side). According to the occlusion of the tube 2212, the liquid in the tube 2212 is transported to a downstream side in order. Consequently, it is possible to realize the liquid feeding pump 2200 that can accurately feed a very small amount of the liquid and is small in size.

Note that the disposition of the members is not limited to the disposition shown in the figure. The liquid feeding pump 2200 does not have to include members such as fingers and may have a configuration in which a ball or the like provided in the rotor 2222 occludes the tube 2212. The liquid feeding pump 2200 explained above can be utilized in an administering device that administers chemical liquid such as insulin to a human body. By using the piezoelectric driving device 100 as explained above, since dielectric breakdown of the piezoelectric driving device 100 less easily occurs, it is possible to realize the liquid feeding pump 2200 having high reliability.

7. Experiment Examples

The invention is further explained below with reference to experiment examples. However, the invention is not limited to the experiment examples.

Forty samples equivalent to the piezoelectric elements 110 according to the invention (samples satisfying the conditions of the disposition of the first electrode layer 130, the second electrode layer 150, and the wiring layer 250) and forty samples not satisfying the conditions of the piezoelectric elements of the invention were created. In both the samples, on a silicon substrate, Pt was used as a first electrode layer, PZT was used as a piezoelectric layer, Pt was used as a second electrode layer, $Al_2O_3$ was used as an insulating layer, and Cu was used as a wiring layer. The second electrode layer and the wiring layer were conducted by a contact section.

In the experiment examples, samples satisfying the conditions of the disposition of the first electrode layer 130, the second electrode layer 150, and the wiring layer 250 shown in FIGS. 5A to 5E and samples not satisfying the conditions of the disposition of the first electrode layer 130, the second electrode layer 150, and the wiring layer 250 shown in FIGS. 11A to 11F were created and evaluated. FIGS. 11A to 11F are plan schematic view of the samples used in the experiment examples and are schematic diagrams of a cross section taken along the longitudinal direction of the samples. In FIGS. 11A to 11F, the active section 160 is hatched. Patterning of the second electrode layer and the wiring layer was performed in shapes shown in FIGS. 5A to 5E and FIGS. 11A to 11F to form an active section having a rectangular (oblong) shape. The samples were created according to the rules of semiconductor manufacturing.

As the evaluation of the samples, a durable waveform having a sine wave of 20 kHz and amplitude of 100 V (0 to +100 V) was applied to each of samples N=40 for 300 hours at a room temperature and a relation of a (dielectric) breakdown occurrence ratio with an application time was checked. Note that, when the piezoelectric elements of the samples are applied to a piezoelectric driving device, the samples are sometimes driven at a higher frequency and a lower voltage. However, the frequency and the voltage were set as explained above with an intention of performing an acceleration test.

Evaluation criteria are as described below. Evaluation results are shown in FIGS. 5A to 5E and FIGS. 11A to 11F.

Double circle: The dielectric breakdown ratio after the elapse of 300 hours was 0 to 2%

Circle: The dielectric breakdown ratio after the elapse of 300 hours was 2 to 10%

Triangle: The dielectric breakdown ratio after the elapse of 300 hours was 10 to 50%

Cross: The dielectric breakdown ratio after the elapse of 300 hours was 50 to 100%

Broken parts of the dielectrically broken-down samples were observed by an optical microscope. It was found that, in all of the dielectrically broken-down samples having the structures shown in FIGS. 5A to 5E, the breakdown occurred in the contact sections. Most of the samples shown in FIGS. 11A to 11F were broken down. It was found that, in all of the broken-down samples, the breakdown occurred at the end portions of the wiring layers in the latitudinal direction of the active sections.

As explained above, it was found that, in the samples satisfying the conditions of the disposition of the first electrode layer 130, the second electrode layer 150, and the wiring layer 250 according to the invention, breakdown at the end portion of the wiring layer 250 in the latitudinal direction of the active section 160 was suppressed and insulation resistance was high.

Figure 12:
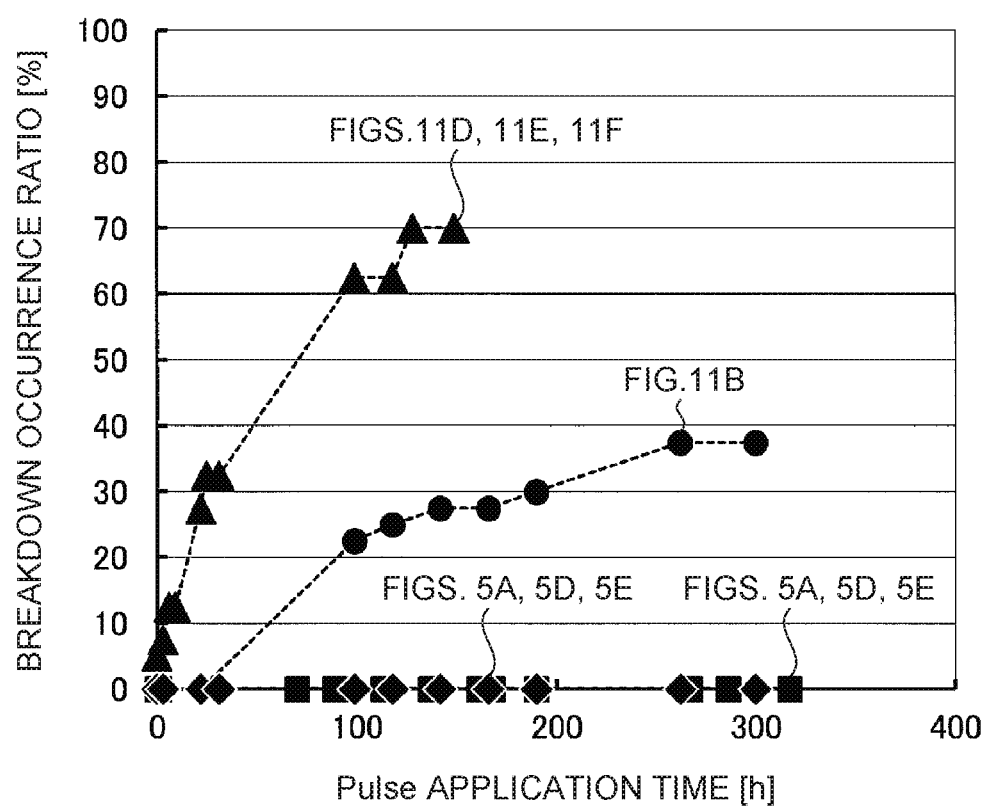
FIG. 12 is a graph showing evaluation results of the experiment examples.

FIG. 12 is a graph showing a part of the evaluation results of the piezoelectric elements of several forms of the experiment examples. The vertical axis of the graph shown in FIG. 12 indicates an occurrence ratio of dielectric breakdown (a ratio of the number of broken-down samples among the forty samples) and the horizontal axis indicates a pulse application time.

As shown in FIG. 12, it was found that, in the samples satisfying the conditions of the disposition of the first electrode layer 130, the second electrode layer 150, and the wiring layer 250 according to the invention (in the graph, the samples plotted on the horizontal axis) (attached with signs FIGS. 5A, 5D, and 5E), dielectric breakdown did not occur for a long period and reliability was extremely satisfactory. On the other hand, it was found that, in the samples not satisfying the conditions of the disposition of the first electrode layer 130, the second electrode layer 150, and the wiring layer 250 according to the invention (in the graph, attached with signs FIGS. 11B, 11D, 11E, and 11F), dielectric breakdown occurred in a long period and reliability was not satisfactory.

The invention is not limited to the embodiments. Various modifications of the invention are possible. For example, the invention includes configurations substantially the same as the configurations explained in the embodiments (configurations in which functions, methods, and results are the same or configurations in which objects and effects are the same). The invention includes configurations in which nonessential portions of the configurations explained in the embodiments are substituted. The invention includes configurations that achieve action and effects same as the action and effects of the configurations explained in the embodiments or configurations that can achieve objects same as the objects of the configurations explained in the embodiments. The invention includes configurations obtained by adding publicly-known techniques to the configurations explained in the embodiments.

The entire disclosure of Japanese Patent Application No. 2016-015772, filed Jan. 29, 2016 is expressly incorporated by reference herein.

What is claimed is:

1. A piezoelectric driving device comprising:
a vibrating plate;
a first electrode layer provided above the vibrating plate;
a piezoelectric layer provided above the first electrode layer;
a second electrode layer provided above the piezoelectric layer;
an insulating layer provided to cover upper surfaces of the first electrode layer, the piezoelectric layer, and the second electrode layer; and
a wiring layer provided above the insulating layer, the wiring layer conducting with the second electrode layer, wherein
an active section is formed in a portion where the first electrode layer, the piezoelectric layer, and the second electrode layer overlap one another,
the active section has a longitudinal direction and a latitudinal direction in a plan view,
at both ends in the latitudinal direction, ends of the first electrode layer are disposed in same positions as ends of the wiring layer or further on an outer side than the ends of the wiring layer in the plan view, ends of the second electrode layer are disposed in same positions as the ends of the wiring layer or further on an inner side than the ends of the wiring layers in the plan view, and the ends of the first electrode layer are disposed further on the outer side than the ends of the second electrode layer, and
at least at one end of the longitudinal direction, an end of the first electrode layer is disposed in a same position as an end of the wiring layer or further on an outer side than the end of the wiring layer in the plan view, an end of the second electrode layer is disposed in a same position as the end of the wiring layer and further on an inner side than the end of the wiring layer in the plan view, and the end of the first electrode layer is disposed further on an outer side than the end of the second electrode layer.

2. The piezoelectric driving device according to claim 1, wherein a length in the longitudinal direction of the active section is 1.001 times or more and 1000 times or less of a length of the active section in the latitudinal direction.

3. A motor comprising:
the piezoelectric driving device according to claim 1; and
a rotor rotated by the piezoelectric driving device.

4. A robot comprising:
a plurality of links;
a joint configured to connect the plurality of links; and
a piezoelectric driving device configured to turn the plurality of links in the joint, the piezoelectric driving device including:
a vibrating plate;
a first electrode layer provided above the vibrating plate;
a piezoelectric layer provided above the first electrode layer;
a second electrode layer provided above the piezoelectric layer;
an insulating layer provided to cover upper surfaces of the first electrode layer, the piezoelectric layer, and the second electrode layer; and
a wiring layer provided above the insulating layer, the wiring layer conducting with the second electrode layer,
wherein an active section is formed in a portion where the first electrode layer, the piezoelectric layer, and the second electrode layer overlap one another,
the active section has a longitudinal direction and a latitudinal direction in a plan view,
at both ends in the latitudinal direction, ends of the first electrode layer are disposed in same positions as ends of the wiring layer or further on an outer side than the ends of the wiring layer in the plan view, ends of the second electrode layer are disposed in same positions as the ends of the wiring layer or further on an inner side than the ends of the wiring layer in the plan view, and the ends of the first electrode layer are disposed further on the outer side than the ends of the second electrode layer, and
at least one end in the longitudinal direction, an end of the first electrode layer is disposed in a same position as an end of the wiring layer or further on an outer side than the end of the wiring layer in the plan view, an end of the second electrode layer is disposed in a same position as the end of the wiring layer and further on an inner side than the end of the wiring layer in the plan view, and the end of the first electrode layer is disposed further on an outer side than the end of the second electrode layer.

5. A pump comprising:
a piezoelectric driving device including:
a vibrating plate;
a first electrode layer provided above the vibrating plate;
a piezoelectric layer provided above the first electrode layer;
a second electrode layer provided above the piezoelectric layer;
an insulating layer provided to cover upper surfaces of the first electrode layer, the piezoelectric layer, and the second electrode layer; and
a wiring layer provided above the insulating layer, the wiring layer conducting with the second electrode layer;
a tube for transporting liquid; and
a plurality of fingers configured to occlude the tube according to driving of the piezoelectric driving device,
wherein an active section is formed in a portion where the first electrode layer, the piezoelectric layer, and the second electrode layer overlap one another,
the active section has a longitudinal direction and a latitudinal direction in a plan view,
at both ends in the latitudinal direction, ends of the first electrode layer are disposed in the same positions as ends of the wiring layer or further on an outer side than the ends of the wiring layer in the plan view, ends of the second electrode layer are disposed in same positions as the ends of the wiring layer or further on an inner side than the ends of the wiring layer in the plan view, and the ends of the first electrode layer are disposed further on the outer side than the ends of the second electrode layer, and at least one end of the longitudinal direction, an end of the first electrode layer is disposed in a same position as an end of the wiring layer or further on an outer side than the end of the wiring layer in the plan view, an end of the second electrode layer is disposed in a same position as the end of the wiring layer and further on an inner side than the end of the wiring layer in the plan view, and the end of the first electrode layer is disposed further on an outer side than the end of the second electrode layer.

\* \* \* \* \*